United States Patent
Koyanagi (10) Patent No.: US 7,771,535 B2
(45) Date of Patent: Aug. 10, 2010

(54) SEMICONDUCTOR MANUFACTURING APPARATUS

(75) Inventor: Kenichi Koyanagi, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 879 days.

(21) Appl. No.: 11/511,507

(22) Filed: Aug. 29, 2006

(65) Prior Publication Data

US 2007/0051310 A1    Mar. 8, 2007

(30) Foreign Application Priority Data

Aug. 30, 2005    (JP)    ............... 2005-250361

(51) Int. Cl.
| | |
|---|---|
| C23C 16/455 | (2006.01) |
| C23C 16/448 | (2006.01) |
| C23C 16/458 | (2006.01) |
| C23F 1/00 | (2006.01) |
| H01L 21/306 | (2006.01) |
| C23C 16/06 | (2006.01) |
| C23C 16/22 | (2006.01) |

(52) U.S. Cl. .................... 118/715; 156/345.1
(58) Field of Classification Search .......... 118/715; 156/345.1
See application file for complete search history.

(56) References Cited

U.S. PATENT DOCUMENTS 6,281,141 B1 *    8/2001    Das et al. ............... 438/770
2003/0215569 A1*    11/2003    Mardian et al. ......... 427/248.1

FOREIGN PATENT DOCUMENTS

| JP | 2004-23043 | 1/1994 |
| JP | 6-275608 | 9/1994 |
| JP | 11-236675 A | 8/1999 |
| JP | 2003-282554 A | 10/2003 |

OTHER PUBLICATIONS

Japanese Office Action dated Dec. 3, 2008 with partial English-Language Translation.

* cited by examiner

*Primary Examiner*—Rudy Zervigon
(74) *Attorney, Agent, or Firm*—McGinn IP Law Group, PLLC (57) ABSTRACT

A semiconductor manufacturing apparatus has a nozzle with a plurality of tiny holes. The nozzle is connected to a vacuum pump through a valve without closing its end so as to be evacuated and purged independently of the reaction chamber.

12 Claims, 8 Drawing Sheets

PRIOR ART

SEMICONDUCTOR MANUFACTURING APPARATUS

This application claims priority to prior Japanese patent application JP 2005-250361, the disclosure of which is incorporated herein by reference.

BACKGROUND OF THE INVENTION

1. Field of the Invention

The present invention relates to semiconductor manufacturing apparatuses, and particularly to a semiconductor manufacturing apparatus having a nozzle with a plurality of tiny holes arranged corresponding to a plurality of semiconductor substrates disposed in a loader, and through which a reactant gas is supplied to each semiconductor substrate to form a desired layer on the substrates.

2. Description of the Related Art

As semiconductor devices become ever denser and smaller, the insulating layer of a capacitor, particularly in a DRAM (dynamic random access memory), has a trench (deep hole) with a higher aspect ratio (depth/width). Accordingly, known CVD (chemical vapor deposition) becomes unsuitable to form a uniform capacitor insulating layer in the trench with a high aspect ratio. In order to overcome this problem, atomic layer deposition (ALD) is increasingly carried out to form the insulating layer. ALD is a method for forming a desired film by depositing atomic layers on top of one another. For example, when a hafnium oxide (HfO) layer is formed on a semiconductor substrate placed at a constant temperature in a reaction chamber, a Hf source gas tetrakis (ethylmethylamino) hafnium (TEMAH, $Hf(N(CH_3)(C_2H_5))_4$) and an oxidizing agent ozone ($O_3$) are alternately introduced. In this process, excess TEMAH is removed to prevent the reaction with ozone in a gas phase, by performing evacuation and inert gas purge between the steps of introducing TEMAH and ozone. The reaction of these gases inhibits atomic layer deposition and thus makes it difficult to form a uniform layer in the trench.

A series of six steps of TEMAH introduction, evacuation, inert gas purge, ozone introduction, evacuation, and inert gas purge forms a layer to a thickness of about 0.1 nm. For example, a 6 nm thick hafnium oxide insulating layer in a DRAM capacitor is formed by 60 series of these steps. For the formation of a uniform layer in the trench, each step requires at least 10 seconds. Therefore, the single series of the steps takes 60 seconds while 60 series takes 3600 seconds. Because of such a process time, it is quite difficult to ensure high productivity in a process using a sheetfed ALD apparatus, which treats semiconductor substrates one at a time.

In order to ensure high productivity in an ALD process, it is necessary to use a batch ALD apparatus which is capable of treating a plurality of semiconductor substrates at a time. For example, in case where 100 semiconductor substrates are treated under the above-mentioned conditions, a sheetfed apparatus requires about 100 hours, but a batch apparatus requires only 5 hours or less. The batch apparatus can treat 25 or more substrates at a time and is much superior in productivity.

Figure 1:
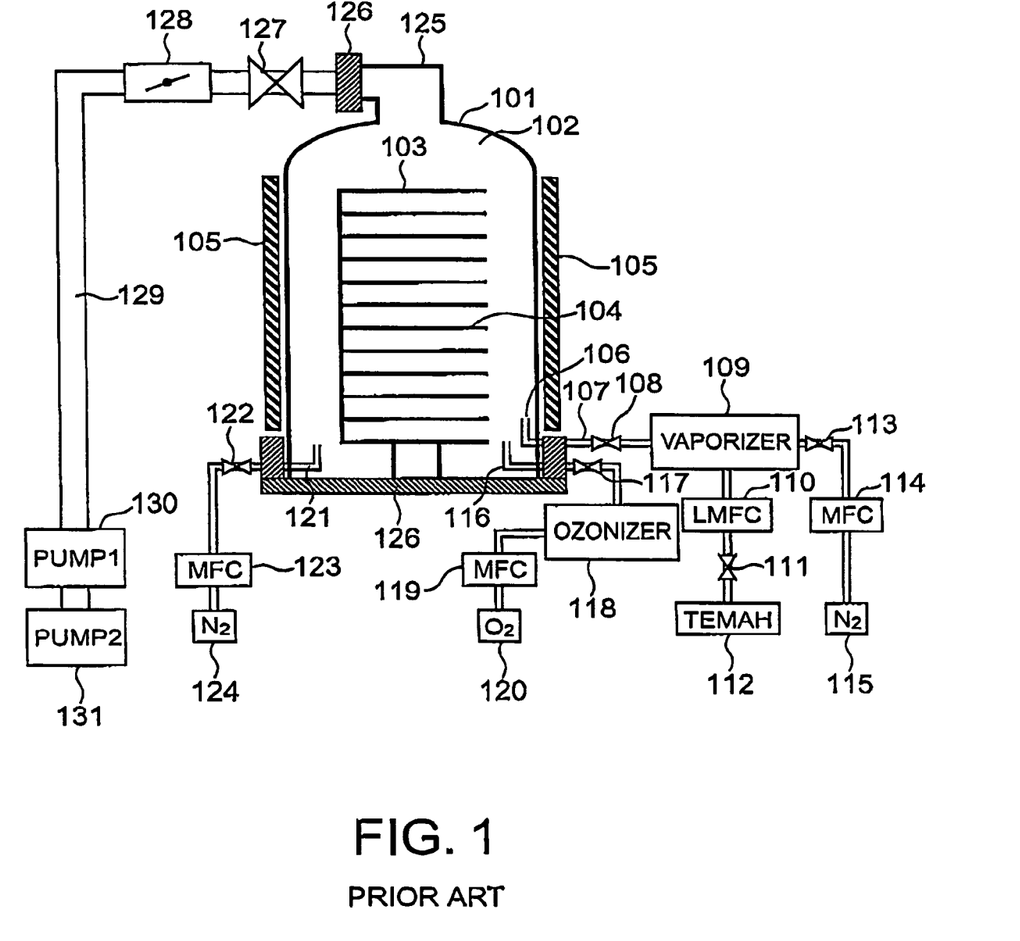
FIG. 1 is a schematic sectional view of a reaction chamber of a known semiconductor manufacturing apparatus.

FIG. 1 is a schematic representation of a known batch ALD apparatus used for forming a hafnium oxide layer.

The known batch ALD apparatus includes a reaction tube 101 defining a reaction chamber 102 and having an evacuation port 125 at its top. The evacuation port 125 is connected to a vacuum valve 127 with a joint 126. The vacuum valve 127 is connected to a pressure-regulating valve 128, and is further connected to vacuum pumps 130 and 131 through a vacuum pipe 129. In the reaction chamber 102, a boat 103 supported by a boat loader 126 holds a plurality of semiconductor substrates 104. The reaction tube 101 is provided with a heater 105 around the periphery to heat the semiconductor substrates 104. A hafnium source gas is introduced into the reaction chamber from a TEMAH source 112 through a TEMAH inlet valve 111, a liquid flow controller (for example, liquid mass flow controller, LMFC) 110, a vaporizer 109, a valve 108, an inlet pipe 107, and a nozzle 106 in that order. The vaporizer 109 is fed with nitrogen from a nitrogen source 115 through a flow controller (for example, mass flow controller, MFC) 114 and a TEMAH carrier $N_2$ inlet valve 113. At the same time, the oxidizing gas, or ozone gas, is introduced into the reaction chamber from an oxygen source 120 through a flow controller (MFC) 119, an ozonizer 118, an ozone inlet valve 117, and a nozzle 116 in that order. The reaction chamber is purged with nitrogen gas introduced from another nitrogen source 124 through a flow controller (MFC) 123, a purge $N_2$ inlet valve 122, and a nozzle 121 in that order.

The structure shown in FIG. 1 has been disclosed in Japanese Unexamined Patent Application Publication No. 6-275608, in FIG. 3. According to the structure shown in FIG. 1 or in an embodiment of this patent document, the TEMAH nozzle 106 is open in the vicinity of the bottom of the reaction chamber. In this event, TEMAH introduced through the TEMAH nozzle 106 is sufficiently supplied on semiconductor substrates placed at lower positions in the reaction chamber, but is insufficient for semiconductor substrates at higher positions. As a result, the thickness of the resulting hafnium oxide layer is seriously varied for the semiconductor substrates from the lowermost position to the uppermost position.

Figure 2:
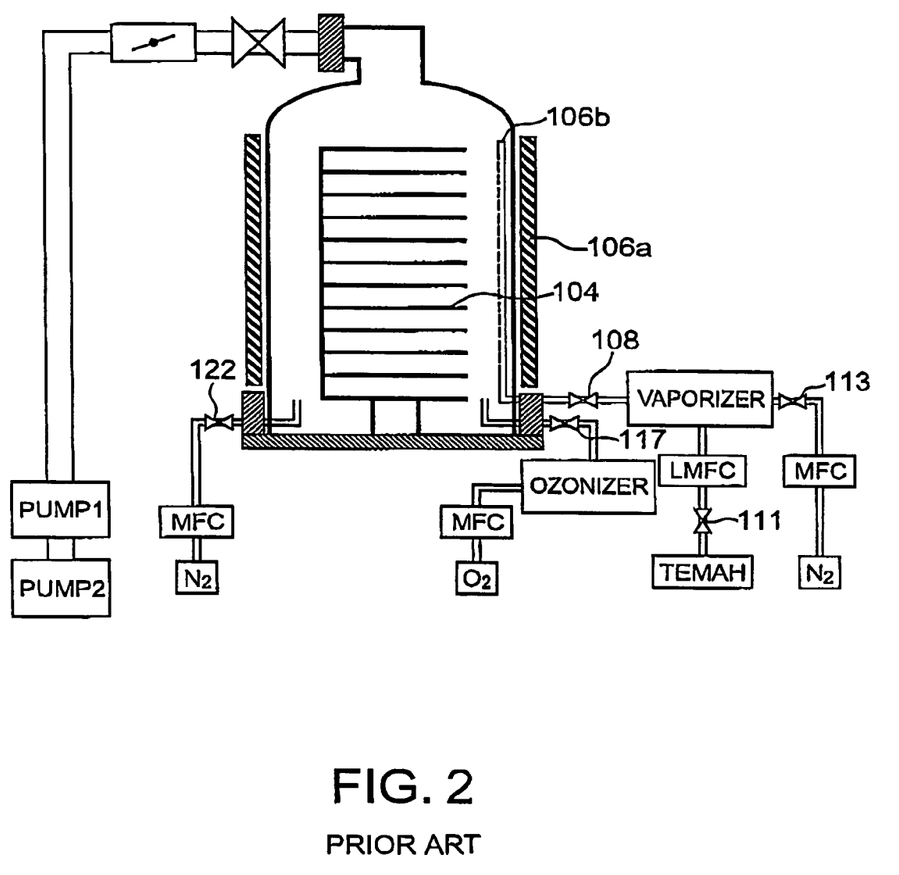
FIG. 2 is a schematic sectional view of a reaction chamber of another known semiconductor manufacturing apparatus.

In order to overcome this disadvantage, as shown in FIG. 2, proposal has been made of an apparatus which has a nozzle extending to a higher position in the reaction chamber. This nozzle 106a has a plurality of tiny holes corresponding to the positions of the semiconductor substrates 104, and its end is closed with a clog 106b. This structure can uniformly supply a source gas to each semiconductor substrate. In this manner, the disadvantage can be overcome that the layers on the respective semiconductor substrates have thicknesses varying in the vertical direction of the reaction chamber. Japanese Unexamined Patent Application Publication No. 2004-23043, FIG. 1 has disclosed a similar structure.

Figure 3:
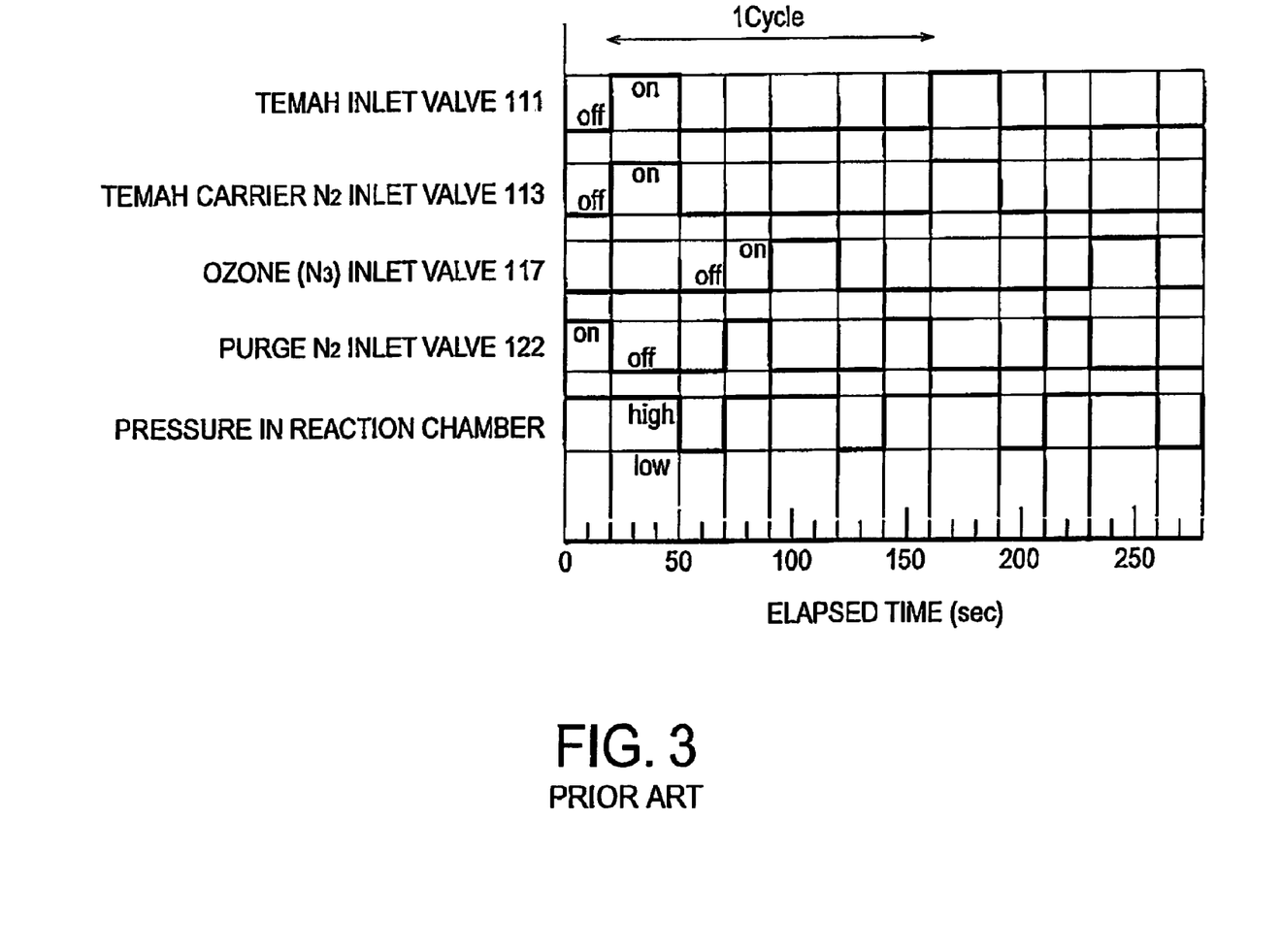
FIG. 3 is a sequence of a known deposition process.

An exemplary step in which the apparatus shown in FIG. 2 deposits a hafnium oxide layer will be described with reference to a deposition sequence shown in FIG. 3. In the sequence, the horizontal axis represents the elapsed time(s).

The semiconductor substrates are allowed to stand at 250° C. in the reaction chamber for the first 0 to 20 seconds. Then, the purge $N_2$ inlet valve 122 is opened to introduce $N_2$ to the reaction chamber. The reaction chamber is thus maintained at a constant high pressure.

In the next step, after 20 to 50 seconds from the beginning, on closing the purge $N_2$ inlet valve 122, the TEMAH inlet valve 111 and the TEMAH carrier $N_2$ inlet valve 113 are opened (with the valve 108 always open) to introduce TEMAH into the reaction chamber. At this stage, TEMAH is jetted through the tiny holes of the nozzle 106a and adsorbed at a level of atomic layer on the surface of the semiconductor substrate 104.

In the next step, after 50 to 70 seconds from the beginning, the TEMAH inlet valve 111 and the TEMAH carrier $N_2$ inlet valve 113 are closed to stop the introduction of TEMAH so that the reaction chamber is evacuated. Thus, excess TEMAH remaining in reaction chamber is removed and the pressure in the reaction chamber is reduced to a low level.

In the next step, after 70 to 90 seconds from the beginning, the purge $N_2$ inlet valve 122 is opened to purge the reaction chamber with $N_2$ and to increase the pressure in the reaction chamber so that the reaction chamber is maintained at a constant high pressure. This step also contributes to the removal of the residual TEMAH from the reaction chamber.

In the next step, after 90 to 120 seconds from the beginning, the purge $N_2$ inlet valve 122 is closed to stop the introduction of the purge $N_2$, and besides the ozone inlet valve 117 is opened to introduce ozone into the reaction chamber. At this stage, the TEMAH deposited on the semiconductor substrate 104 is oxidized by the ozone into hafnium oxide at a level of atomic layer. The hafnium oxide has a thickness of about 0.1 nm, but is not in a form of film.

In the next step, after 120 to 140 seconds from the beginning, the ozone inlet valve 117 is closed so that the reaction chamber is evacuated to reduce the pressure in the reaction chamber to a low level. In the next step, after 140 to 160 second from the beginning, the purge $N_2$ inlet valve 122 is opened to purge the reaction chamber with $N_2$ and to increase the pressure in the reaction chamber so that the reaction chamber is maintained at a high pressure. Thus, a series of steps for depositing hafnium oxide is completed. This series is continuously repeated until a hafnium oxide layer is formed to a desired thickness.

Unfortunately, the apparatus having the nozzle with a plurality of tiny holes and the deposition using the apparatus have the following disadvantages.

Since the end of the TEMAH delivering nozzle shown in FIG. 2 is closed with a clog 106b, the residual TEMAH have to be removed through the tiny holes from the nozzle. It is however not easy to efficiently discharge the residual TEMAH from the nozzle. In the above-described deposition of hafnium oxide, the residual TEMAH still remains in the nozzle even if the steps of evacuating the reaction chamber and purging the reaction chamber with $N_2$ are performed with TEMAH introduction stopped.

Consequently, the TEMAH remaining in the nozzle reacts with subsequently introduced ozone in a gas phase to produce hafnium oxide on the semiconductor substrates in the vicinity of the nozzle. Thus, the uniformity of the in-plane thickness of the resulting layer is degraded. Further, the resulting layer may not sufficiently coat the surface in the trench. Furthermore, hafnium oxide easily deposits in the nozzle, particularly around the tiny holes. The deposit may reduce the diameter of the tiny holes, or may peel off and adversely act as particulate matter.

SUMMARY OF THE INVENTION

Accordingly, the present invention provides a semiconductor manufacturing apparatus capable of forming such a uniform layer as sufficiently coats the internal surface of the trench by atomic layer deposition, and which can ensure in-plane uniformity of the resulting layer while preventing the generation of particulate matter.

According to one aspect of the present invention, a semiconductor manufacturing apparatus is provided which includes a nozzle disposed close to a plurality of semiconductor substrates lying separately from each other in the vertical direction. The nozzle has a plurality of tiny holes arranged corresponding to the positions of the semiconductor substrates. The nozzle jets a gas for forming a layer on each semiconductor substrate through the tiny holes. An end of the nozzle is connected to an evacuation mechanism through a pipe. The evacuation mechanism evacuates the nozzle to remove the gas through the pipe.

The nozzle may include a plurality of nozzles. At least one of the nozzles jets an organic gas, and at least one of the other nozzles jets an oxidizing gas, a nitriding gas, or a reducing gas.

According to another aspect of the present invention, a semiconductor manufacturing apparatus includes a reaction chamber, a nozzle and a vacuum pump. The nozzle is disposed close to a plurality of semiconductor substrates placed separately from each other in a vertical direction and which is placed inside the reaction chamber. The nozzle has a plurality of holes arranged corresponding to positions of the semiconductor substrates. The nozzle jets a gas for forming a layer on each semiconductor substrate through the holes. The vacuum pump is placed outside the reaction chamber. The nozzle is connected to the vacuum pump through a valve without closing an end of the nozzle so as to be evacuated and is purged independently of the reaction chamber.

Thus, the semiconductor manufacturing apparatus has a nozzle for delivering a reactant gas whose end is not clogged, and the nozzle is connected to a vacuum pump with a pipe. Consequently, the nozzle can be evacuated independently of the reaction chamber without using the tiny holes of the nozzle.

Consequently, the residual reactant gas can be prevented from remaining in the nozzle. Since the reactant gas is completely removed from the nozzle, a gas phase reaction can be prevented even though another gas is introduced into the reaction tube, and the deposition of a thin layer is prevented. Thus, the semiconductor manufacturing apparatus can prevent the generation of particulate matter and ensure in-plane uniformity of the resulting layer.

DESCRIPTION OF THE PREFERRED EMBODIMENTS

Embodiments of the present invention will now be described with reference to the drawings.

First Embodiment

Figure 4:
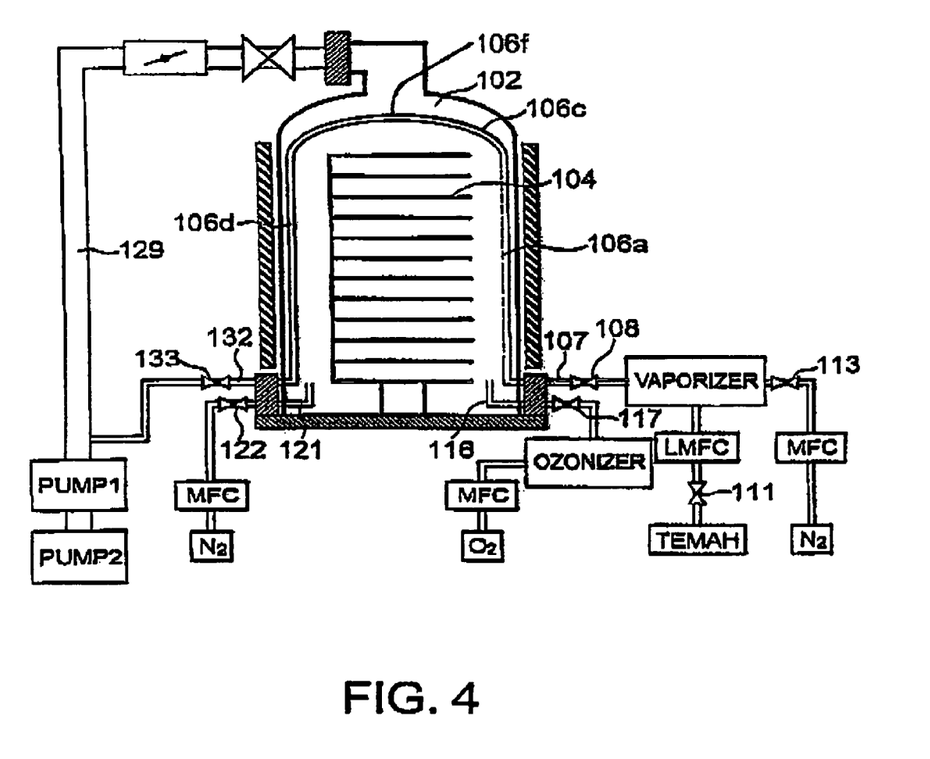
FIG. 4 is a schematic sectional view of a reaction chamber of a semiconductor manufacturing apparatus according to a first embodiment of the present invention.
Figure 5A:
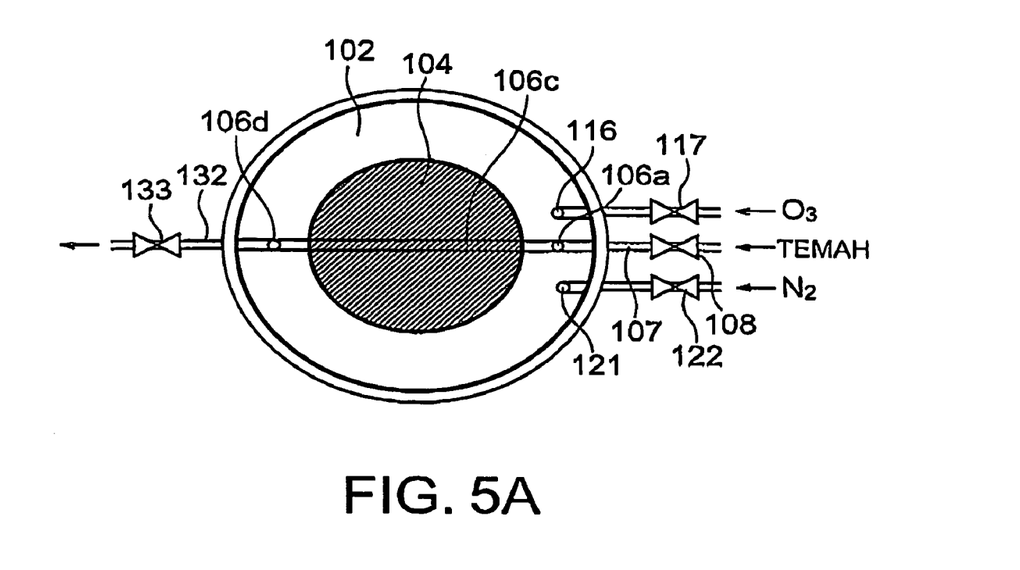
FIG. 5A is a plan view of the reaction chamber shown in FIG. 4
Figure 5B:
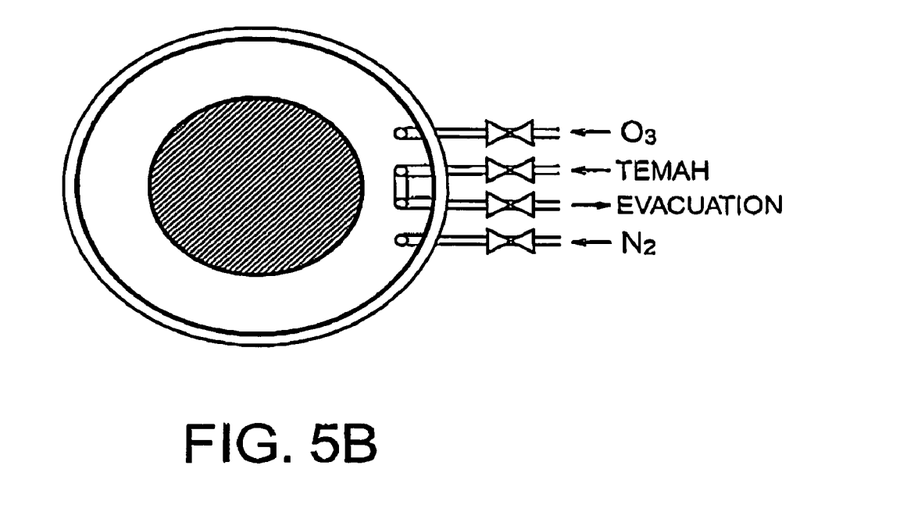
FIG. 5B is a plan view of a reaction chamber according to a modification of the first embodiment.

A semiconductor manufacturing apparatus according to a first embodiment will now be described which forms a hafnium oxide layer by ALD, with reference to FIGS. 4 and 5A and 5B. FIG. 4 is a schematic sectional view of the semiconductor manufacturing apparatus, and FIGS. 5A and 5B are each a schematic plan view of the apparatus. Components or members other than the TEMAH nozzle are the same as those of the known apparatus shown in FIG. 1, described in the Related Art, and the same description is not repeated.

As shown in FIG. 4, the apparatus of the present embodiment has a nozzle 106a with a tiny holes arranged corresponding to the positions of semiconductor substrates 104. The nozzle 106a is extended with a quarter-turn extension 106c through an overlaying portion 106f that overlays the semiconductor substrates 104 to a joint pipe 106d connected to an external pipe 132. The joint pipe 106d is opposed to the nozzle 106a. The nozzle 106a is thus connected to the vacuum pipe 129 through an automatic TEMAH nozzle outlet valve 133.

FIG. 5A is a plan view of the apparatus shown in FIG. 4. The semiconductor substrates 104 are disposed in the center of the reaction chamber 102. The reaction chamber has a purge $N_2$ nozzle 121 with a purge $N_2$ inlet valve 122 through which purge $N_2$ is introduced, and an ozone nozzle 116 with an ozone inlet valve 117 through which an oxidizing gas ozone ($O_3$) is introduced. The source gas TEMAH is delivered through an inlet pipe 107 with a valve 108. The inlet pipe 107 is connected to the nozzle 106a through which the source gas is jetted. The nozzle 106a is connected to the quarter-turn extension 106c and the joint pipe 106d opposed to the nozzle 106a. The joint pipe 106d is connected to a vacuum pump through the external pipe 132 and the automatic TEMAH nozzle outlet valve 133. Although the external pipe 132 is provided so as to oppose the inlet pipe 107 in the present embodiment, the position of the external pipe 132 is not limited to this. For example, the external pipe 132 may be disposed such that the source gas inlet pipe turns back directly, as shown in FIG. 5B. The nozzle 106a is preferably fixed with a retainer or the like to prevent its vibration so that the reactant gas is evenly delivered to each semiconductor substrate.

While the nozzle connected to the vacuum pump is used for delivering the source gas TEMAH in the first embodiment, other nozzles may be connected to the vacuum pump. For example, the ozone nozzle may have the same structure as the TEMAH nozzle. The oxidizing gas, ozone, may be replaced with a reducing or nitriding gas, such as ammonia ($NH_3$), depending on the layer to be formed. The number of the nozzles may be set according to the number of source gases. While FIG. 4 illustrates a gas feeding system in which TEMAH is introduced as a source gas, a plurality of source gases may meet each other to be mixed through the inlet pipe 107, and thus the gas mixture is delivered through the nozzle 106a.

Second Embodiment

A deposition sequence according to a second embodiment of the present invention will now be described on the basis of the operation of the valves shown in FIG. 4.

Figure 6:
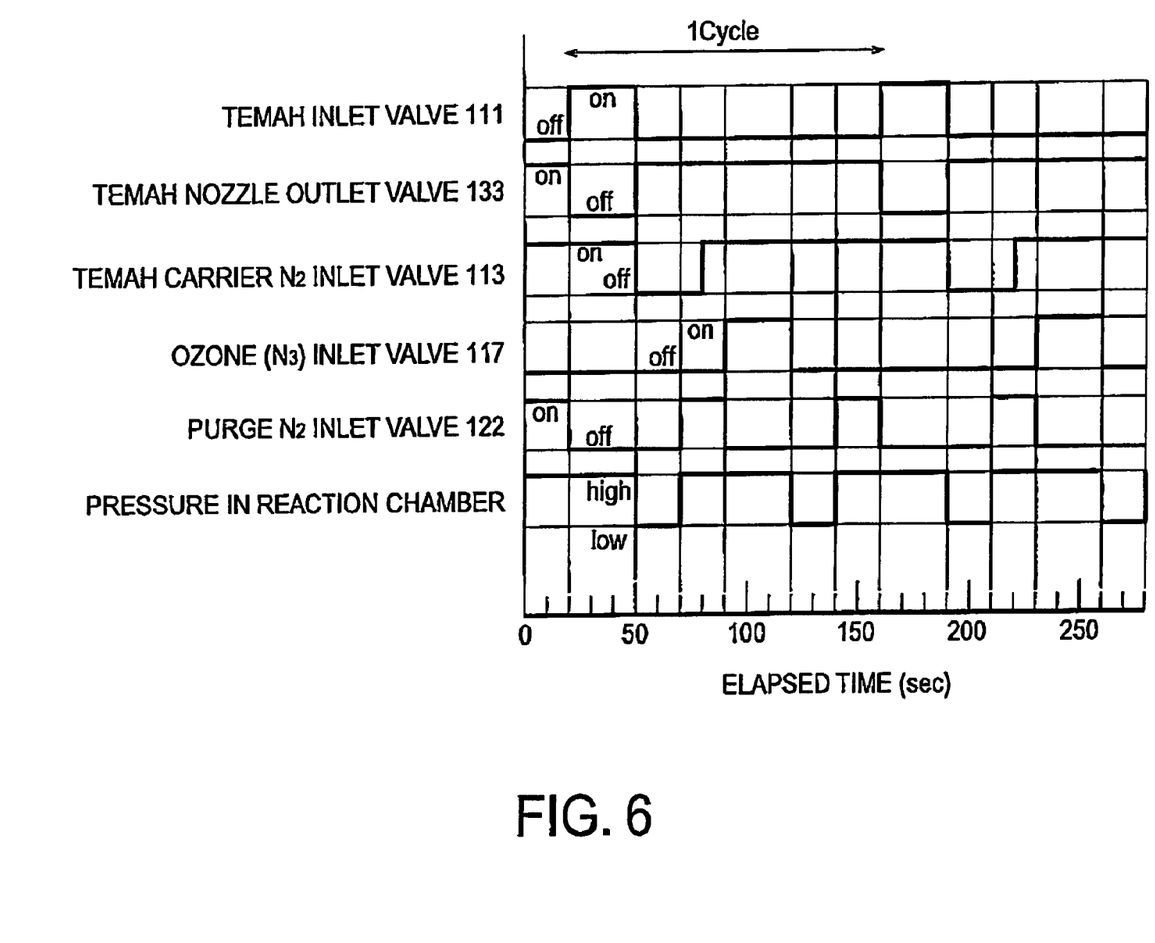
FIG. 6 is a sequence of a deposition process performed in the semiconductor manufacturing apparatus according to the first embodiment.

For the first 0 to 20 seconds, the valves are in a standby state before deposition. Although it takes about 30 minutes in practice to stabilize the temperature in the reaction chamber 102 in which the semiconductor substrates 104 are disposed, the present embodiment treats the time as 20 seconds, for the sake of convenience. The semiconductor substrates are allowed to stand at 250° C. In this standby state, the purge $N_2$ inlet valve 122 is opened to introduce purge $N_2$ gas into the reaction chamber 102 and to increase the pressure in the reaction chamber 102 to a high level.

The flow rate of the purge $N_2$ gas is set at 20 slm, and the pressure in the reaction chamber 102 is set at 50 Pa. At the same time, the TEMAH carrier $N_2$ inlet valve 113 and the TEMAH nozzle outlet valve 133 are opened so that the TEMAH inlet nozzle is purged with $N_2$ (with the valve 108 always open). The flow rate of the carrier $N_2$ is set at 1 slm.

In the next step, after 20 to 50 seconds from the beginning, the purge $N_2$ inlet valve 122 is closed to stop the introduction of the purge $N_2$ into the reaction chamber 102. At the same time, the TEMAH inlet valve 111 is opened to introduce TEMAH into the reaction chamber 102 with the TEMAH nozzle outlet valve 133 closed. The flow rate of the TEMAH is set at 1 sccm. The pressure in the reaction chamber 102 is maintained at the pressure in the standby state to thereby be set at 50 Pa.

In this stage, the TEMAH is adsorbed to the surface of the semiconductor substrate. The TEMAH nozzle outlet valve 133 may not be closed exactly simultaneously with opening the TEMAH inlet valve 111.

In the next step, after 50 to 70 seconds from the beginning, the TEMAH inlet valve 111 and the TEMAH carrier $N_2$ inlet valve 113 are closed and the TEMAH nozzle outlet valve 133 is opened. The purge $N_2$ inlet valve 122 is kept closed.

In this stage, the TEMAH remaining in the reaction chamber and the nozzle is evacuated. The pressure in the reaction chamber is reduced to a low level of 5 Pa.

In the next step, after 70 to 90 seconds from the beginning, the purge $N_2$ inlet valve 122 is opened to purge the reaction chamber with $N_2$. In addition, the TEMAH carrier $N_2$ inlet valve 113 is opened to purge the nozzle with $N_2$ at the point of 80 seconds.

This $N_2$ purge step following the foregoing evacuation step can eliminate the problem particularly with residual TEMAH remaining in the nozzle. At this stage, the pressure in the reaction chamber is set at a high level of 150 Pa.

In the next step, after 90 to 120 seconds from the beginning, the purge $N_2$ inlet valve 122 is closed to stop the introduction of $N_2$ into the reaction chamber 102. At the same time, the ozone inlet valve 117 is opened to introduce ozone into the reaction chamber 102. Specifically, oxygen is supplied to an ozonizer 118 from an oxygen source 120 at a flow rate of 10 slm to generate ozone at a flow rate of 500 sccm, and the ozone is introduced to the reaction chamber 102. The pressure in the reaction chamber 102 is maintained at the pressure in the preceding step of 150 Pa.

In this stage, the TEMAH adsorbed on the surface of the semiconductor substrate is oxidized by ozone into hafnium oxide at a level of atomic layer.

In the next step, after 120 to 140 seconds from the beginning, the ozone inlet valve 117 is closed and the reaction chamber is evacuated for a time to reduce the pressure in the reaction chamber to a low level of 8 Pa. Subsequently, in the step after 140 to 160 seconds from the beginning, the purge $N_2$ inlet valve 122 is opened to purge the reaction chamber so that the pressure in the reaction chamber is increased to a high level of 50 Pa.

At this stage, a sequence of gas introduction is completed. Subsequently, the same sequence is continuously repeated 60 times from the step of TEMAH introduction to form a hafnium oxide layer on the semiconductor substrate.

While the second embodiment describes a deposition sequence for the case where the nozzle connected to a vacuum pump is used for delivering TEMAH, the ozone supply line may use a similar nozzle with tiny holes to the TEMAH nozzle so as to remove the residual ozone remaining in the nozzle immediately by evacuation. If a plurality of nozzles with tiny holes is provided, different evacuation sequences can be applied to the respective nozzles.

While the present embodiment uses TEMAH as a source gas, any other organic liquid or gas, such as trimethylaluminum (TMA, $Al(CH_3)_3$), may be used without particular limitation.

In the present embodiment, the TEMAH carrier $N_2$ inlet valve 113 is closed from the point of 50 seconds to the point of 80 seconds to increase the evacuation efficiency after the introduction of TEMAH is stopped. However, the TEMAH carrier $N_2$ inlet valve 113 is not necessarily closed, and the TEMAH remaining in the nozzle can be removed effectively even if the TEMAH carrier $N_2$ inlet valve 113 is open.

Third Embodiment

Figure 7:
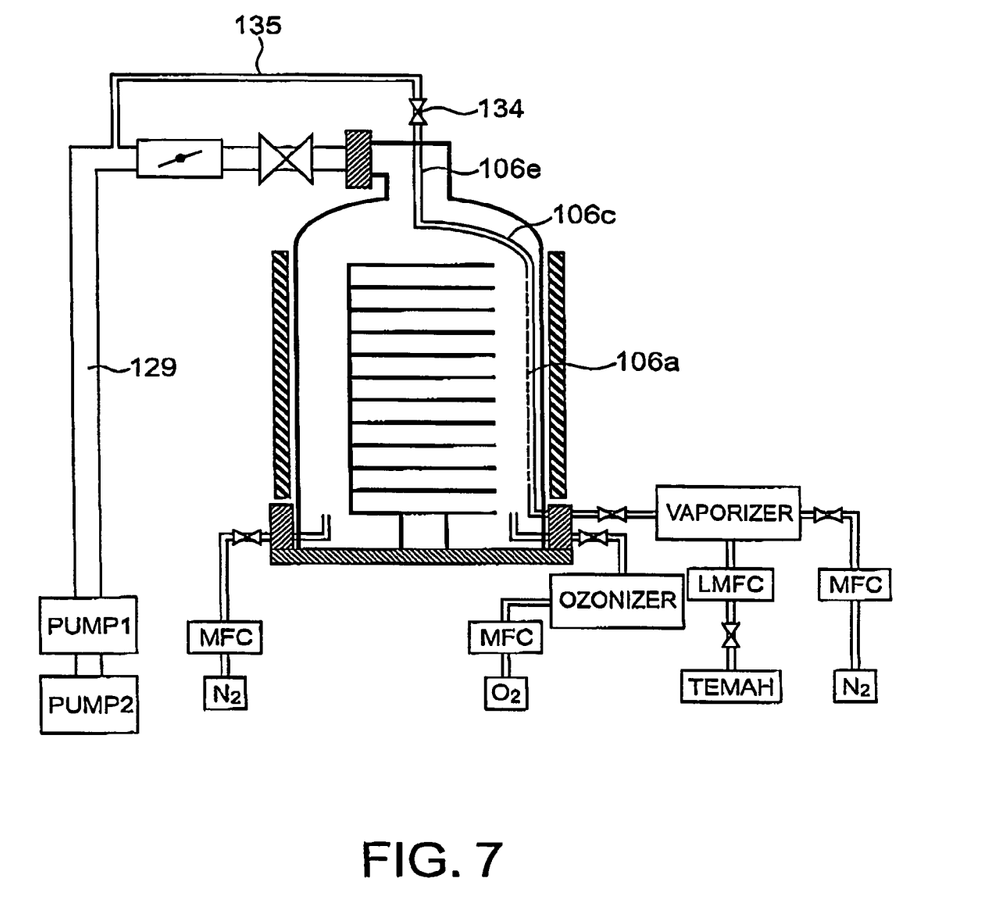
FIG. 7 is a schematic sectional view of a reaction chamber of a semiconductor manufacturing apparatus according to a second embodiment of the present invention.

Another apparatus according to a third embodiment will be described in which the nozzle 106a is drawn out from the top of the reaction chamber, as shown in FIG. 7. The deposition sequence used in the second embodiment is also used for the present embodiment.

The quarter-turn extension 106c connected to the end of the nozzle 106a is drawn out of the reaction chamber with an external connection pipe 106e from the middle of the top, without being drawn downward in the reaction chamber, and is further connected to a vacuum pipe 129 through an automatic TEMAH nozzle outlet valve 134 and a pipe 135.

EXAMPLE

The hafnium oxide layer was formed on the semiconductor substrates using the apparatus according to the first embodiment and the sequence according to the second embodiment. The resulting layer was evaluated for the particulate matter trapped on the surface of the semiconductor substrate and the in-plane uniformity of the layer on the semiconductor substrate. The results are shown in FIG. 8 with comparison with the known apparatus shown in FIG. 2 using the known sequence.

Figure 8:
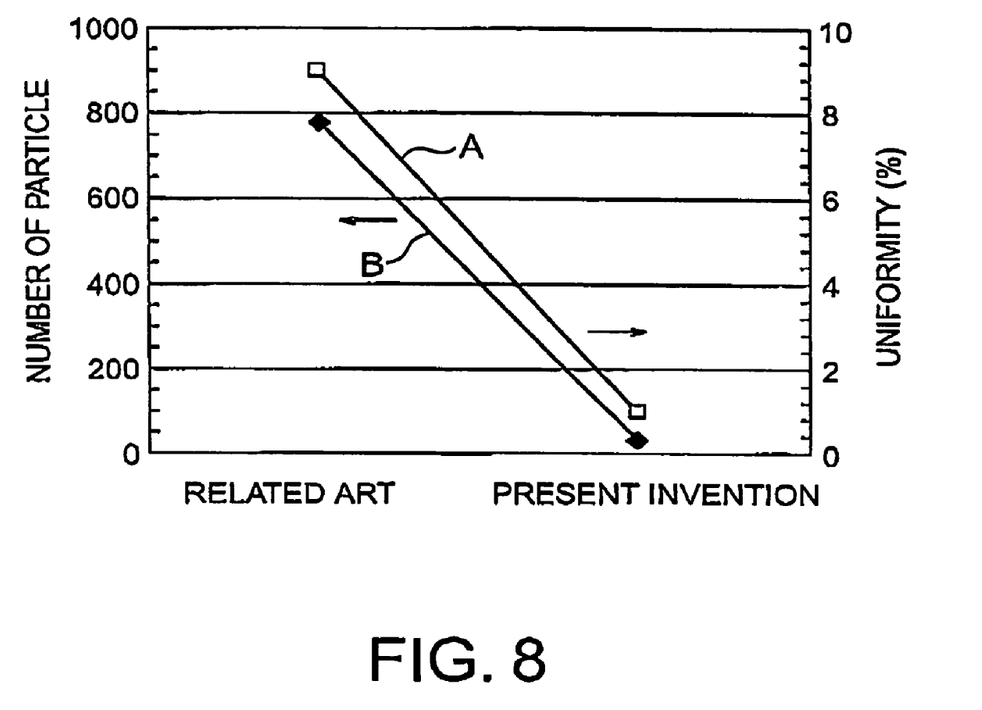
FIG. 8 is a comparative plot of the number of particles and the in-plane uniformity.

FIG. 8 shows the number of particles on the substrate and the in-plane uniformity of the resulting layer that were measured after 25 batches each in which 51 substrates of 300 mm in diameter were treated. For the number of particles, particles of 0.2 µm or more were counted with a laser beam scattering particle counter. For the in-plane uniformity, thicknesses were measured at 49 points of the substrate with an ellipsometer. The in-plane uniformity was defined as the quotient obtained by dividing the difference between the largest thickness and the smallest thickness by the average thickness. A substrate located in the middle of 51 substrates was measured for these values.

The known apparatus evaluated for the comparison has a nozzle with tiny holes whose end is closed. In FIG. 8, Line A represents the in-plane uniformity, and line B represents the results of the number of particles. While the known technique exhibited about 800 particles and a uniformity of about 9%, the apparatus according to the first embodiment with the deposition sequence according to the second embodiment reduced the number of particles to 30 and improved the uniformity to 1%.

What is claimed is:

1. A semiconductor manufacturing apparatus, comprising:
a reaction chamber;
a nozzle which is disposed close to a plurality of semiconductor substrates placed separately from each other in a vertical direction and which is placed inside the reaction chamber, the nozzle having a plurality of holes arranged corresponding to positions of the semiconductor substrates, the nozzle jetting a gas for forming a layer on each semiconductor substrate through the holes; and
a vacuum pump which is placed outside the reaction chamber,
wherein the nozzle is connected to the vacuum pump through a valve without closing an end of the nozzle such that the nozzle is evacuated and purged independently of the reaction chamber.

2. The semiconductor manufacturing apparatus according to claim 1, wherein the gas comprises an organic gas.

3. The semiconductor manufacturing apparatus according to claim 1, wherein:
the nozzle includes a plurality of nozzles.

4. The semiconductor manufacturing apparatus according to claim 3, wherein:
at least one of the plurality of nozzles jets an organic gas, and at least one of the other nozzles jets a gas selected from the group consisting of oxidizing gases, nitriding gases, and reducing gases.

5. The semiconductor manufacturing apparatus according to claim 2, wherein the organic gas comprises a single constituent gas or a mixture of a plurality of different gases.

6. The semiconductor manufacturing apparatus according to claim 4, wherein the organic gas comprises a single constituent gas or a mixture of a plurality of different gases.

7. A semiconductor manufacturing apparatus, comprising:
a nozzle which is disposed plurality of semiconductor substrates placed separately from each other in a vertical direction, the nozzle having a plurality of holes arranged corresponding to positions of the semiconductor substrates, the nozzle jetting a gas for forming a layer on each semiconductor substrate through the holes;
an evacuation mechanism which is connected to an end of the nozzle through a pipe, the evacuation mechanism evacuating the nozzle to remove the gas through the pipe; and
another pipe, comprising:
a vertical portion comprising the nozzle, the nozzle extending in a direction perpendicular to the layer;
an overlaying portion comprising the pipe, the overlaying portion overlaying the plurality of semiconductor substrates;
a quarter-turn extension connecting the nozzle with the pipe; and
a joint pipe connected the overlaying portion to the evacuation mechanism,
wherein the another pipe continuously extends in the reaction chamber from a valve which introduces the as to the nozzle to another valve which is connected to the evacuation mechanism.

8. A semiconductor manufacturing apparatus, comprising:
a nozzle which is disposed close to a plurality of semiconductor substrates placed separately from each other in a vertical direction, the nozzle having plurality of holes arranged corresponding to positions of the semiconductor substrates, the nozzle jetting a gas for forming a layer on each semiconductor substrate through the holes;
an evacuation mechanism which is connected to an end of the nozzle through a pipe, the evacuation mechanism evacuating the nozzle to remove the gas through the pipe; and
a reaction chamber which extends in the vertical direction,
wherein the evacuation mechanism evacuates the nozzle through a valve without evacuating the reaction chamber through the valve.

9. A semiconductor manufacturing apparatus, comprising:
a nozzle which is disposed close to a plurality of semiconductor substrates placed separately from each other in a vertical direction, the nozzle having a plurality of holes arranged corresponding to positions of the semiconductor substrates, the nozzle jetting a gas for forming a layer on each semiconductor substrate through the holes;
an evacuation mechanism which is connected to an end of the nozzle through a pipe, the evacuation mechanism evacuating the nozzle to remove the gas through the pipe; and
a plurality of boats supported by a boat loader, each of the boats holds one of the semiconductor substrates,
wherein the boats are extended in the vertical direction through the boat loader, parallel to the nozzle, such that one of the holes corresponds to one of the boats.

10. The semiconductor manufacturing apparatus according to claim 1, wherein the nozzle jets the gas parallel to the layer, and
wherein the plurality of holes extends through the nozzle in a direction perpendicular to the layer, and
wherein the nozzle comprises a vertical pipe which extends in a direction perpendicular to the layer.

11. The semiconductor manufacturing apparatus according to claim 1, further comprising:
a continuous pipe, comprising:
a vertical portion comprising the nozzle, the nozzle extending in a direction perpendicular to the layer;
an overlaying portion overlaying the plurality of semiconductor substrates;
a quarter-turn extension connecting the nozzle to the overlaying portion; and
a joint pipe connecting the overlaying portion to the vacuum pump,
wherein the continuous pipe extends in the reaction chamber from another valve which introduces the gas to the nozzle to the valve, and
wherein the vacuum pump evacuates the nozzle to remove the gas without evacuating the reaction chamber through the valve.

12. The semiconductor manufacturing apparatus according to claim 1, further comprising:
a plurality of boats supported by a boat loader, each of the boats holds one of the semiconductor substrates, and
wherein the boats are extended in the vertical direction through the boat loader, parallel to the nozzle, such that one of the holes corresponds to one of the boats.

* * * * *